(12) United States Patent
Kikuchi

(10) Patent No.: US 6,518,092 B2
(45) Date of Patent: Feb. 11, 2003

(54) SEMICONDUCTOR DEVICE AND METHOD FOR MANUFACTURING

(75) Inventor: Hidekazu Kikuchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/794,108

(22) Filed: Feb. 28, 2001

(65) Prior Publication Data

US 2002/0005568 A1 Jan. 17, 2002

(30) Foreign Application Priority Data

Jul. 13, 2000 (JP) ...................................... 2000-213174
Oct. 17, 2000 (JP) ...................................... 2000-316592

(51) Int. Cl.[7] .......................... H01L 21/44; H01L 21/48; H01L 21/50
(52) U.S. Cl. ................. 438/107; 438/108; 438/110; 438/113; 438/114; 438/126; 438/613; 438/614; 438/665
(58) Field of Search .................. 438/665, 964, 438/107, 108, 110, 113, 114, 126, 613, 614

(56) References Cited

U.S. PATENT DOCUMENTS

| | | | | |
|---|---|---|---|---|
| 5,414,297 A | * | 5/1995 | Morita et al. ................ | 257/503 |
| 6,004,867 A | * | 12/1999 | Kim et al. ................... | 438/458 |
| 6,028,347 A | * | 2/2000 | Sauber et al. ............... | 257/618 |
| 6,028,773 A | * | 2/2000 | Hundt ......................... | 174/250 |
| 6,075,290 A | * | 6/2000 | Schaefer et al. ............. | 257/737 |
| 6,194,249 B1 | * | 2/2001 | Chen et al. .................. | 438/106 |
| 6,255,737 B1 | * | 7/2001 | Hashimoto ................... | 257/208 |
| 6,323,542 B1 | * | 11/2001 | Hashimoto ................... | 257/417 |

OTHER PUBLICATIONS

"Nikkei Microdevices"; Apr. 1998; pp 164–166.

* cited by examiner

*Primary Examiner*—David E. Graybill
(74) *Attorney, Agent, or Firm*—Rabin & Berdo, P.C.

(57) ABSTRACT

A semiconductor device which has trenches for raising the reliability thereof and a method for manufacturing such device. An electrode pad, and a protective film and an interlayer film which comprise an opening on top of this electrode pad, are formed on a substrate. A rewiring pattern which is in contact with the electrode pad at this opening is formed on top of the interlayer film. In addition, a trench is formed, by means of etching, in the region on this interlayer film where said rewiring pattern is not formed. A bump is formed on top of said rewiring pattern. The rewiring pattern and the trench are covered by means of a sealing film. The sealing film exposes the upper end of the bump. An external terminal is formed on the upper end of this bump. The trenches make the contact area between the covering film and the sealing film larger and therefore increase the adhesion between the covering film and the sealing film. The rougher the surface of the trench the better the adhesion between the covering film and the sealing film. Improving the adhesion makes it difficult for the sealing film to become detached so that the semiconductor device becomes more reliable.

26 Claims, 12 Drawing Sheets

SEMICONDUCTOR DEVICE AND METHOD FOR MANUFACTURING

BACKGROUND OF THE INVENTION

1. Field of the invention

The present invention relates to a semiconductor device in which a sealing film is formed on the surface of a substrate and a method for manufacturing said device. The present invention is applied, for example, to a semiconductor device, which uses the wafer, level chip size package method and to a method for manufacturing said device.

2. Description of Related Art

The wafer level chip size package (WCSP) technique is well known as a semiconductor manufacturing technique. WCSP is a technique in which resin sealing is performed before a dicing process.

In WCSP a large number of integrated circuits is formed on the surface of a wafer, and then insulating films comprising protective films, interlayer films and the like are formed on the surface of the wafer so as to expose the center part of each of the electrode pads of these integrated circuits. Next, rewiring patterns are formed on the surface of the exposed face of each pad and on the surface of the interlayer films and, subsequently, bumps are formed on top of this rewiring pattern. The rewiring pattern electrically connects the electrode pads and bumps. Next, a resin sealing film is formed so as to expose the upper ends of these bumps and then external terminals are formed on the upper ends of the bumps.

By using a WCSP technique it is possible to reduce the size of the package and lower manufacturing costs.

In semiconductor devices in which a WCSP technique is employed, one part of the lower surface of the sealing film is in contact with the rewiring pattern and the other part is in contact with the interlayer film. In order to make it more difficult for the sealing film to become detached, it is desirable to increase the size of the contact area between the sealing film and the interlayer film.

However, in contemporary semiconductor devices there tends to be a large number of external terminals. When the number of external terminals increases, the overall area of the rewiring pattern becomes large so that the contact area between the sealing film and the interlayer film is reduced. Therefore, the greater the number of external terminals, the easier it is for the sealing film to become detached.

In addition, in contemporary semiconductor devices there has been a tendency for the chips to become smaller in size. When the chip becomes smaller in size, the contact area between the sealing film and the interlayer film is reduced so that it becomes easier for the sealing film to become detached.

In order to maintain the reliability of semiconductor devices, it is necessary to make it difficult for the sealing film to become detached from the surface of the chip.

SUMMARY OF THE INVENTION

An object of the present invention is to propose a semiconductor device in which it is difficult for the sealing film to become detached, and a method for manufacturing said semiconductor device. In other words, the invention aims to propose a semiconductor device which is highly reliable, and a method of manufacturing such semiconductor devices.

The semiconductor device according to the present invention comprises an electrode pad which is formed on a substrate; a covering film which is formed on the substrate and comprises an opening on top of the electrode pad; a rewiring pattern which is formed on the covering film and makes contact with the electrode pad at the opening; a trench which is formed in the region of the interlayer film where the rewiring pattern is not formed; a bump which is formed on top of the rewiring pattern; and a sealing film which covers the rewriting pattern and the trench, and is formed in such a way that the upper end of the bump is exposed.

The semiconductor device according to the present invention is provided with a trench in the covering film so that the contact area between the covering film and the sealing film is increased and therefore it becomes difficult for the sealing film to become detached.

The method of manufacturing the semiconductor device according to the present invention comprises a process for forming an electrode pad on top of a substrate; a process for forming, on top of the substrate, a covering film which comprises an opening on top of the electrode pad; a process for forming, on top of the covering film, a rewiring pattern which is in contact with the electrode pad at the opening; a process for forming a trench in the region of the covering film where the rewiring pattern is not formed; a process for forming a bump on top of the rewiring pattern; and a process for forming the sealing film which covers the rewiring pattern and the trench, in such a way that the sealing film exposes the upper end of the bump.

The manufacturing method according to the present invention comprises a process for providing a trench in the covering film so that the contact area between the covering film and the sealing film is made larger and therefore it becomes possible to manufacture a semiconductor device in which it is difficult for the sealing film to become detached.

BRIEF DESCRIPTION OF THE DRAWINGS

Other objects and benefits of the present invention will be explained below with reference to the figures appended below.

DESCRIPTION OF THE PREFERRED EMBODIMENTS

Embodiments of the present invention will be explained below with reference to the figures. In the figures, the size of the structural elements, their shape and their arrangement are presented in outline with the degree of detail necessary to permit comprehension. Also, the numerical parameters presented below are merely for illustrative purposes.

First Embodiment

Firstly, a first embodiment of the invention will be explained with reference to FIGS. 1 to 6.

Figure 1:
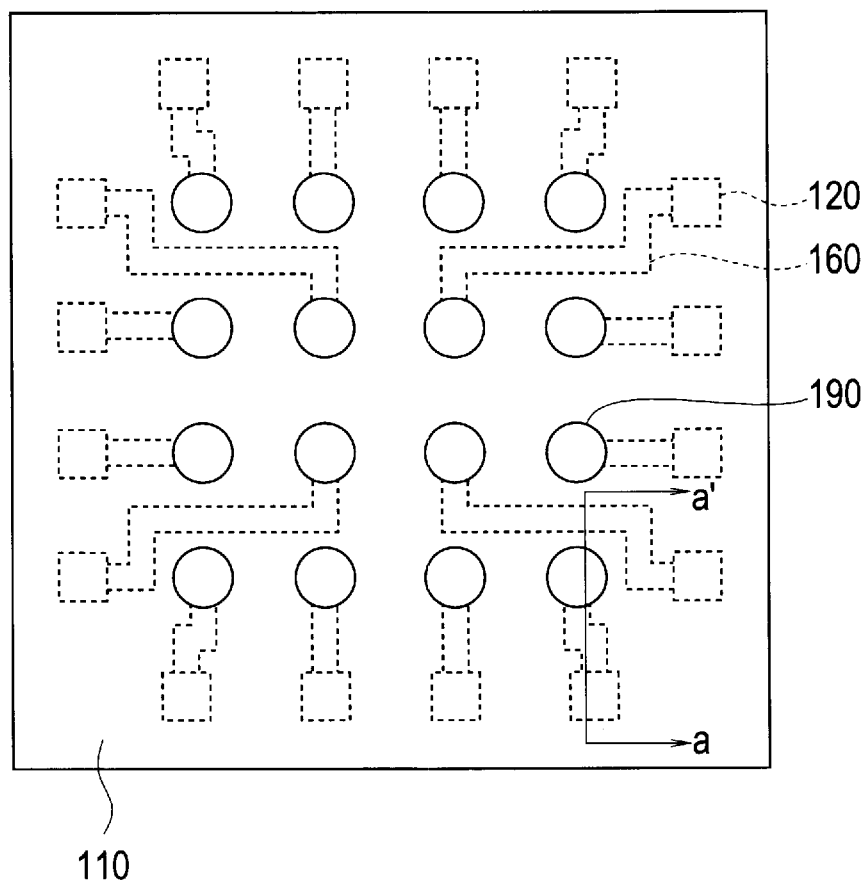
FIG. 1 shows a plan view of the structure of the essential parts of a semiconductor device according to the embodiments of the present invention.
Figure 2:
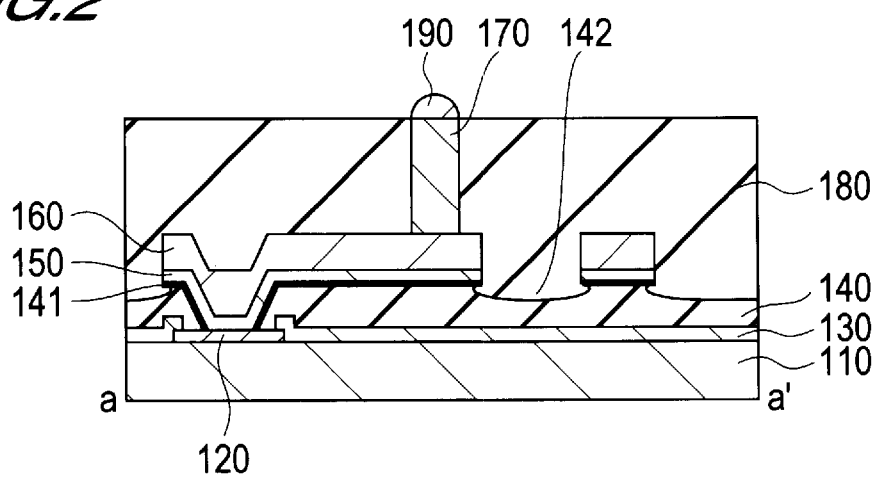
FIG. 2 is a sectional diagram showing the structure of the essential parts of a semiconductor device according to the first embodiment.

FIG. 1 shows a plan view of the structure of the essential parts of the semiconductor device according to this embodiment, FIG. 2 is a diagram of a section along the line a–a' in FIG. 1.

As shown in FIGS. 1 and 2, the semiconductor device according to this embodiment comprises the substrate 110, electrode pad 120, protective film 130, interlayer film 140, metallic thin film 150, metallic wiring 160, bump 170, sealing film 180 and external terminal 190. Only the substrate 110, electrode pad 120, metallic wiring 160, and external terminal 190 are shown in FIG. 1.

The substrate 110 is, for example, rectangular in shape. The size of this substrate 110 is, for example, 8 mm×8 mm or 9 mm×9 mm. As mentioned below, this substrate 110 can be obtained by dicing the wafer after the sealing film 180 has been formed.

Integrated circuits (not shown in the figures) are formed on the surface of the substrate 110. A plurality of electrode pads 120 are formed along the periphery of the integrated circuit. In the example in FIG. 1, four electrode pads 120 are respectively arranged along each of the sides of the substrate 110. In other words a total of sixteen electrode pads 120 are provided on the substrate. In typical semiconductor devices the electrode pads 120 are arranged at equal intervals. The interval between the electrode pads 120 is, for example, approximately 100 µm.

In addition, the same number of external terminals 190 as the number of electrode pads is provided on the substrate 110. In the example in FIG. 1, 4×4 external terminals 190 are arranged at equal intervals in the form of a matrix. Usually, the columns and rows of this matrix are arranged parallel to the sides of the substrate 110.

Each external terminal 190 is electrically connected with the corresponding electrode pad 120. The metallic wiring 160 and the bump 170 are used for this connection.

In the example shown in FIG. 1, the electrode pad 120 is arranged along the periphery of the substrate 110 but the external terminals 190 are arranged in the form of a matrix in the center part of the substrate 110. This type of "rearrangement of the electrodes" is efficient in terms of miniaturizing the substrate 110.

The structural elements shown in FIGS. 1 and 2 will now be explained in detail.

The substrate 110 can be obtained, for example, by dicing a 6-inch (approximately 15.24 centimeter) diameter silicon wafer. In this embodiment, the dicing occurs after the structural elements 120–190 have been formed on the wafer.

The electrode pads 120 are electrode pads of an integrated circuit (not shown in the figures) formed on the surface of the substrate 110. The electrode pads 120 are formed, for example, from aluminum or mixtures of aluminum and silicon or mixtures of aluminum, silica and copper. The electrode pad 120 is 1 µm thick, for example.

The protective layer 130 has the function of protecting the integrated circuits from impacts resulting from the process for forming the conductors or from the die bonding process. The protective film 130 covers the surface of the substrate 110, excepting the center part of the electrode pad 120. The protective film 130 is formed, for example, using silicon oxide, silicon nitride or the like. The protective film 130 is, for example, 1 µm thick. The protective film may have either a single-layer or multi-layer structure.

The interlayer film 140 has the function of alleviating the thermal stress which the integrated circuits are subjected to due to the heat generated by the semiconductor device. The interlayer film 140 covers the surface of the protective film 130 and the outer edge of the exposed area of the electrode pads 120 (in other words the side face of the protective film 130, located on top of the electrode pads 120). The interlayer film 140 is formed, for example, from a high-polymer photosensitive resin (polyimide) or from a high-polymer non-photosensitive resin. The interlayer film 140 is, for example, 1 µm thick. The interlayer film 140 may have either a single-layer or multi-layer structure. A modifying layer 141 is formed in order to increase the adhesion between the interlayer film 140 and the metallic thin film 150. A trench 142 is formed, by means of wet etching, in the interlayer film 140 in the region in which the metallic thin film 150 is not formed. By means of this etching, the exposed area of the interlayer film 140 can be made larger and roughened. Therefore, as a result of this etching the contact area between the interlayer film 140 and the metallic thin film 150 is greatly enlarged. This increases the adhesion between the interlayer film 140 and the metallic thin film 150.

The metallic thin film 150 and the metallic wiring 160 form a rewiring pattern for electrically connecting the electrode pad 120 and the bump 170.

The metallic thin film 150 has the function of increasing the adhesion between the wiring pattern and the interlayer film 140 and the adhesion between the wiring pattern and the electrode pad 120. The metallic film 150 may have either a single-layer or multi-layer structure. When the metallic thin film 150 has a multi-layer structure, the lowest layer of this multi-layer structure is formed in such a way that it prevents the material from which the layer above is formed from diffusing into the interlayer film 140. When the metallic thin film 150 has a 2-layer structure, the lower layer is formed, for example, from chromium, nickel or alloys of titanium and tungsten and the upper layer is formed, for example, from copper or gold. The lower layer is, for example, 150 nanometers thick and the upper layer 600 nanometer thick.

The metallic wiring 160 is formed on top of the metallic thin film 150. The metallic wiring 160 has the function of conducting current through the electrode pad 120 and the bump 170, and therefore it is desirable to form it from a material with low resistance (copper, gold, aluminum or the like). The metallic wiring 160 is, for example, 5 µm thick.

The bump 170 is formed on top of the metallic wiring 160. The bump 170 has, for example, a circular cylindrical shape. The bump 170 is formed from conductive material and usually it is formed from the same material as the metallic wiring 160. The height of the bump 170 is approximately the same as that of the sealing film 180 and is, for example, 100 µm.

The sealing film 180 has the function of packaging the substrate 110 and it covers the entirety of the face of the substrate 110 excluding the upper end of the bump 170. The sealing film 180 is made, for example, from epoxy resin.

The external terminal 190 is installed on the upper end of the bump 170. The external terminal 190 is an electrode for connecting the integrated circuit of the substrate 110 and external circuits when the semiconductor device has been mounted on the circuit board. The external terminal 190 is formed, for example, from solder. The external terminal 190 generally has a hemispherical shape. The external terminal 190 is, for example, 500 μm in diameter.

One example of a method for manufacturing semiconductor device according to this embodiment will now be explained with reference to FIGS. 3 to 6.

FIGS. 3 to 6 are process diagrams illustrating the method of manufacturing this embodiment of a semiconductor device, and they correspond to FIG. 2, and accordingly to the sectional line a–a' in FIG. 1.

Figure 3A:
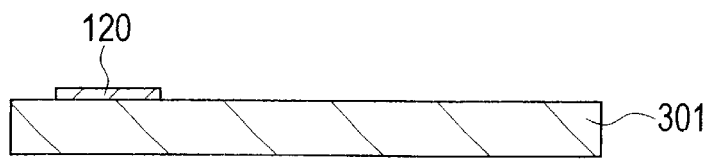
FIGS. 3A to 3G, 4A to 4E, 5A to 5D and 6 are sectional process diagram illustrating the method of manufacturing a semiconductor device according to the first embodiment.

Firstly, a plurality of integrated circuits (not shown in the figures) are formed on the surface of the wafer 301 and then, as shown in FIG. 3A, the electrode pads 120 of these integrated circuits are respectively formed. These electrode pads 120 are formed by depositing metallic film on top of the wafer 301 using a sputtering method for example, and then patterning this metallic film using a photolithography method.

Figure 3B:
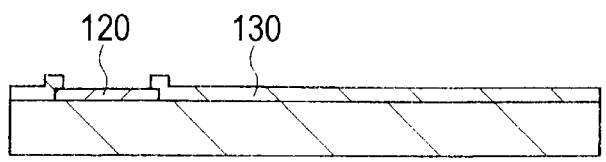

Next, a protective film 130 (as shown in FIG. 3B) is formed on the surface of the wafer 301. In this process, the film is firstly formed on the surface of the wafer 301 using a CVD (Chemical Vapor Deposition) or other deposition technique. Then, the protective film 130 is completed by removing the film from on the top of the center part of the electrode pad 120 using a photolithography technique and an etching technique.

Figure 3C:
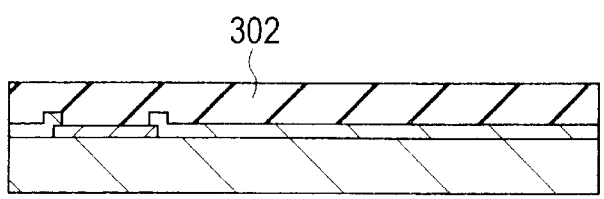
Figure 3D:
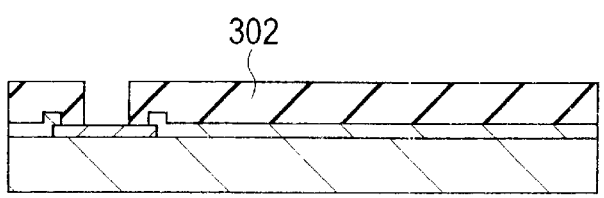
Figure 3E:
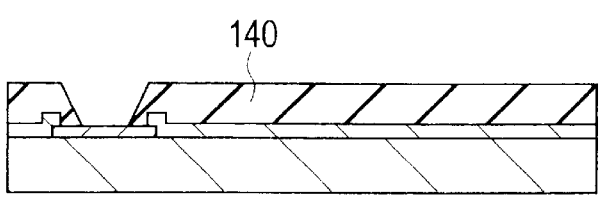

Then, the interlayer film 140 is formed on top of the protective film 130. For example, when the interlayer film 140 is formed from polyimide, a polyimide precursor 302 is firstly deposited over the entire surface of the wafer 301 using a sputtering technique or a similar technique, as shown in FIG. 3C. Next, the center part of the electrode pad 120 is exposed using a photolithography method, as shown in FIG. 3D. Then, the polyimide interlayer film 140 is completed by thermosetting the polyimide precursor 302. This thermosetting causes the interlayer film 140 to shrink. The rate of shrinkage of the interlayer film 140 is greater toward the upper part of the side of the interlayer film 140 and the opening therefore has a tapering section, as shown in FIG. 3E.

After this, if there is residual polyimide on the surface of the electrode pad 120, this polyimide is removed using, for example, plasma etching in an oxygen atmosphere.

Figure 3F:
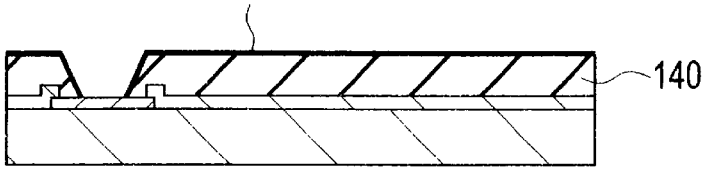

Next, the surface of the interlayer film 140 is modified by plasma processing in an inert gas atmosphere (for example argon gas). Thereby, the modifying layer 141 (as shown in FIG. 3F) is formed. As mentioned above, the adhesion between the interlayer film 140 and the metallic thin film 150 is improved by forming the modifying layer 141.

Figure 3G:
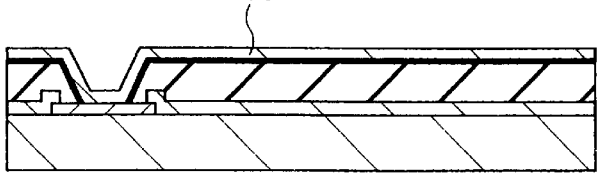

Then, a metallic thin film 303 (as shown in FIG. 3G) is formed over the entire modifying layer 141 by sputtering, for example. Then, the patterning of the metallic wiring 160 is performed as described below.

Figure 4A:
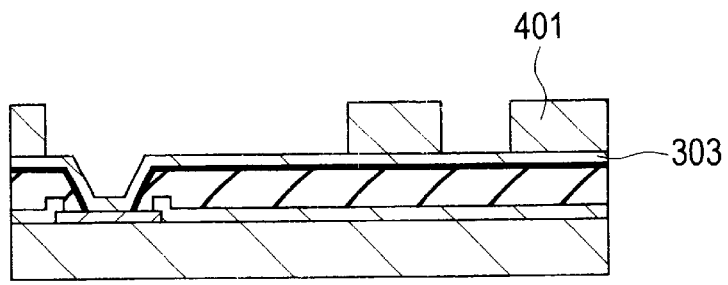

In this process, firstly a resist thick film is formed with a thickness of 10 μm, for example, over the entire surface of the metallic thin film 303 using, for example, a novolak-based resist. In addition, the region of resist thick film where the metallic wiring is to be formed is removed using, for example, a photolithography method. In this way, the resist pattern 401 as shown in FIG. 4A is formed.

Figure 4B:
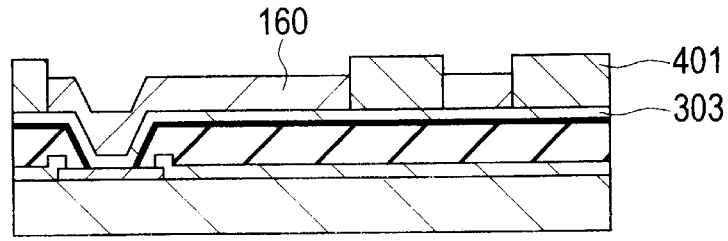
Figure 4C:
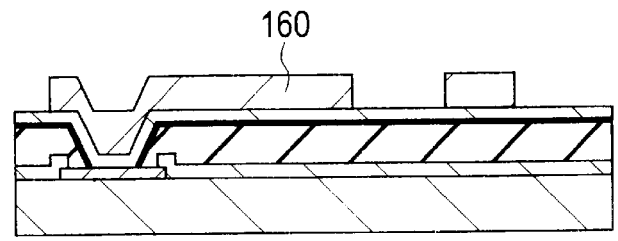

Next, metallic wiring 160 as shown in FIG. 4B is formed over the exposed surface of the metallic film 303 using an electroplating method. In this electroplating process, a resist pattern 401 is used as the mask, and the metallic thin film 303 is used as an electrode. The plating fluid used can be, for example, a cyan-type plating fluid or a non-cyan-type plating fluid. If the metallic wiring 160 is formed from copper, it is possible to use, for example, sulfuric acid solution as the plating fluid. The metallic wiring 160 is thinner than the resist pattern 401. For example, if the metallic wiring 160 is made 5 μm thick, the resist pattern 401 is, as mentioned above, approximately 10 μm thick. After this, the resist pattern 401 is removed using a stripping agent such as acetone. In this way, the metallic wiring 160 as shown in FIG. 4C is completed.

Then, as described below, a bump 170 is formed on top of the metallic wiring 160.

Figure 4D:
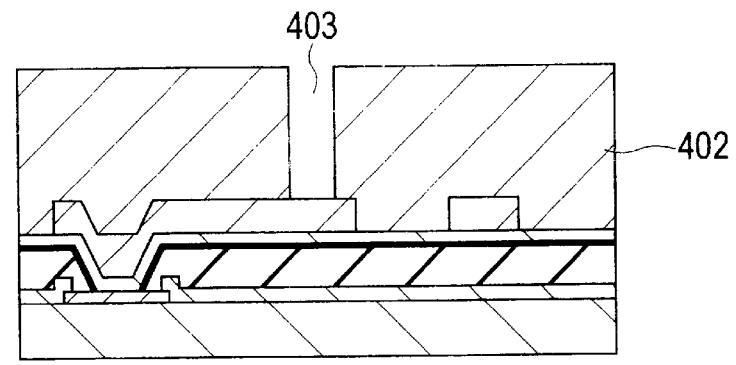

In this process, a resist film such as acryl-esther-based or acryl-resin-based dry film or the like is firstly formed over the entire surface of the wafer 301. This resist film is, for example, 120 μm thick. Then, the resist film is removed from the region where the bump 170 is to be formed, using, for example, a photolithography method. In this way, the resist pattern 402 comprising the opening 403 as shown in FIG. 4D is formed.

Figure 4E:
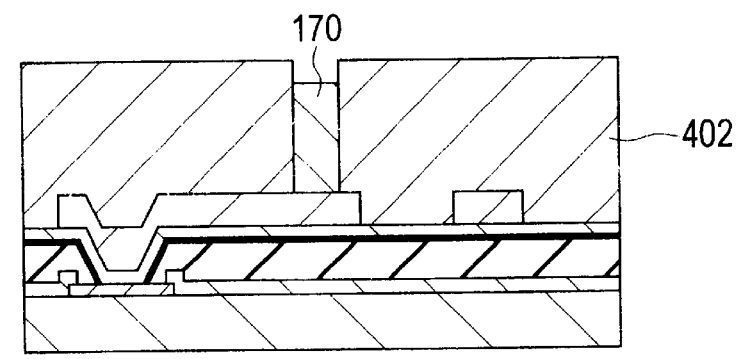
Figure 5A:
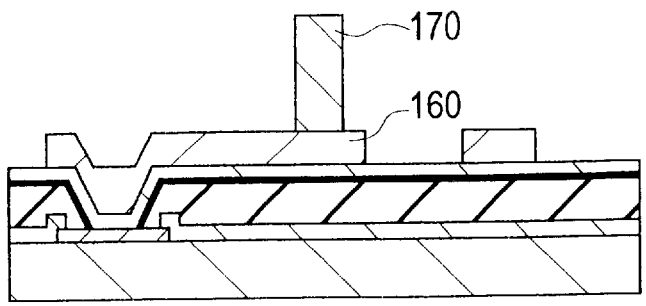

Next, an electroplating method is used to form a bump 170 (as shown in FIG. 4E) on top of the exposed surface of the metallic wiring 160, in other words inside the opening 403. The height of the bump 170 is less than the thickness of the resist pattern 402, for example 100 μm. The bump 170 is generally formed using the same material as for the metallic wiring 160. For this reason, the plating fluid used to form the bump 170 is the same as in the case of the metallic wiring 160. After this, the resist pattern 402 is removed using, for example, a stripping agent such as an aqueous solution of potassium hydroxide, diethylene glycol monobutyl ether or monoethanol amine or the like. In this way, the bump 170 as shown in FIG. 5A is completed.

Figure 5B:
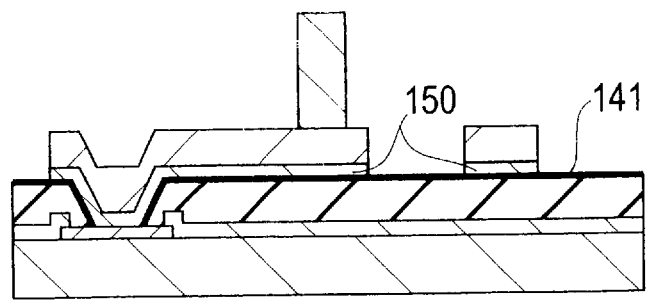

Then, as shown in FIG. 5B, the exposed part of the metallic thin film 303 is removed with a plasma etching technique using the pattern of the metallic wiring 160 as mask. This etching is carried out in an oxygen atmosphere, for example. By means of this patterning, the pattern of the metallic thin film 150 is completed. The modifying layer 141 is exposed in the region in which the metallic thin film 303 has been removed.

Figure 5C:
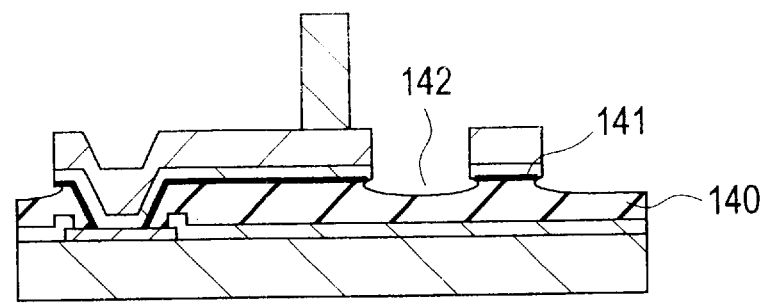

Then, as shown in FIG. 5C, the exposed surface of the modifying layer 141 is removed by means of wet etching. In addition, in this wet etching process, the part of the interlayer 140 which is below the modifying layer 141 is also removed. In this way, the trench 142 is formed in the interlayer 140. The etching solution used can be, for example, permanganic acid, hydrazine or sulfuric acid. The etching time is, for example, several minutes to several tens of minutes.

This wet etching has two objectives.

The first objective is to stop leakage of the electric current in the metallic wiring 160. The interlayer film 140 is an insulating element but the modifying layer 141, in other words the interlayer film 140 which has been modified by the plasma processing is a conductor. Under normal manufacturing conditions, when several volts are applied to this modifying layer 141, a leakage current of several microamperes flows. Therefore, in order to prevent the leakage current in the metallic wiring 160, it is desirable to remove the part of the modifying layer 141 which is not covered by rewiring patterns 150, 160.

The second objective of this wet etching is to improve the adhesion between the interlayer film 140 and the sealing film 180. The trench 142 is formed in the interlayer film 140 by means of this etching. For this reason, the surface of this interlayer film 140 is increased in comparison with cases in which only the modifying layer 141 is etched, i.e. cases in which the surface of the interlayer film 140 is smooth after the etching process. In addition, the surface area of the interlayer film 140 becomes rougher after etching (in other words the degree of smoothness is reduced). Therefore, the adhesion can be improved because this wet etching greatly increases the contact area between the interlayer film 140 and the sealing film 180. In the present invention, the depth of the trench 142, in other words the depth of the etching is not limited but in order to enlarge the contact area it is desirable to etch until just before the protective layer 130 is exposed.

Figure 5D:
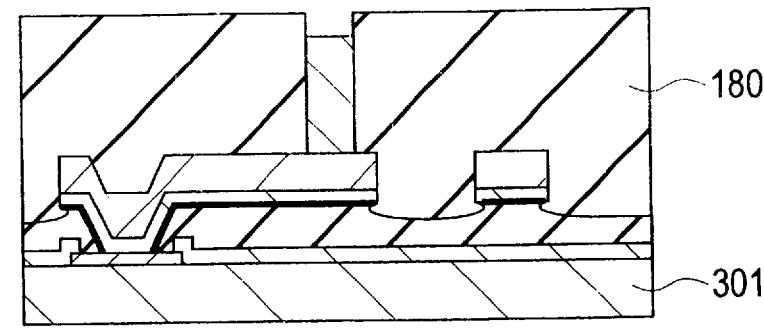

Next, as shown in FIG. 5D, the sealing film 180 is formed on the surface of the wafer 301.

Figure 6:
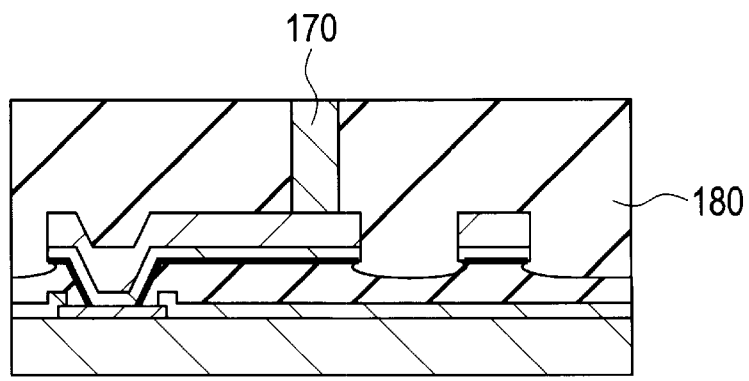

In this process, the wafer 301 is placed inside a metallic mold (not shown in the diagram) and then a resin to be used as a sealing film is poured into this metallic mold. In this way, a sealing film 180 which covers the entire surface of the wafer 301 (as shown in FIG. 5D) is formed. Furthermore, the upper end of the bump 170 is exposed by polishing the surface of the sealing film 180. In this way, as shown in FIG. 6, the thickness of the sealing film 180 becomes approximately the same as the height of the bump 170.

Then the external terminal 190 is formed on the upper end of the bump 170 (see FIG. 2). As mentioned above, this external terminal 190 is formed, for example, from solder and into a hemispherical shape.

Finally, the dicing process is carried out. In this process, the wafer 301 is cut up into chips. In this way, the semiconductor device as shown in FIGS. 1 and 2 is completed.

As explained above, in this embodiment of the semiconductor, a trench 142 with a rough surface is provided in the interlayer film 140. Therefore, the adhesion between the interlayer film 140 and the sealing film 180 is greatly improved. For this reason, this embodiment of the semiconductor has the advantage that it is difficult for the sealing film 180 to become detached, so that it is highly reliable.

In addition, in the method of manufacturing this embodiment of a semiconductor device, the modifying layer 141 can be removed at the same time as the trench 142 is formed in the interlayer film 140. Therefore, there is the advantage that with this embodiment of the manufacturing process a highly reliable semiconductor can be manufactured using a small number of processes.

Second Embodiment

Next, a second embodiment of the present invention will be explained with reference to FIGS. 7 and 8.

Figure 7:
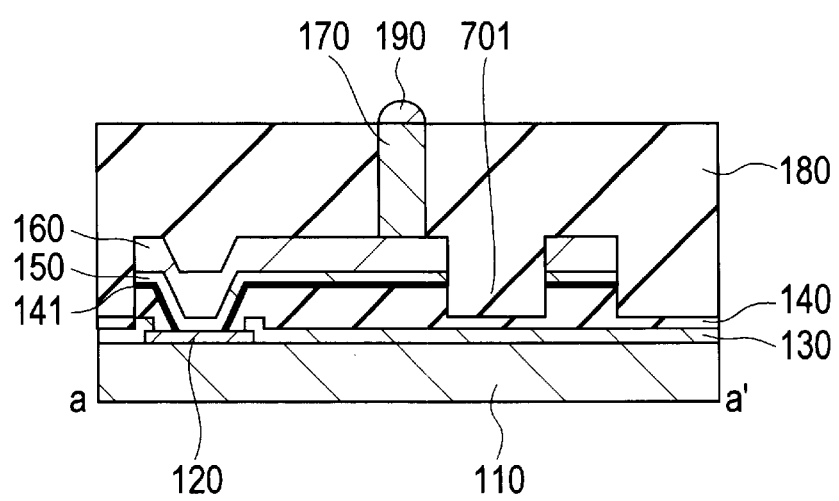
FIG. 7 is a sectional diagram showing the structure of the essential parts of a semiconductor device according to the second embodiment.

FIG. 7 is a sectional diagram of this embodiment, corresponding to the cross section along line a–a' in FIG. 1. In FIG. 7, wherever the same symbols are used as in FIG. 2, they refer to the same structural elements as in FIG. 2.

In the semiconductor according to this embodiment, the trench formed in the interlayer film 140 differs from that according to the first embodiment.

In this embodiment, the trench 701 is formed by means of plasma etching. By using a plasma etching method, it is possible to carry out highly anisotropic etching. In other words, when plasma etching is used, even though the depth of the trench 701 is made large, the amount of etching in the direction parallel to the substrate 110 does not become very large. Therefore, the plasma etching can form a deep trench 701 without removing the interlayer film 140 directly below the metallic thin film 150 and the metallic wiring 160. For this reason, even though the trench 701 is made deep, the yield and the reliability of the semiconductor device are not reduced.

In order to increase the adhesion of the sealing film 180, it is desirable to make the trench 701 as deep as possible. By using plasma etching it is possible to form an extremely deep trench 701 without reducing the yield of the semiconductor device or its reliability. In addition, in the same way as in wet etching, plasma etching makes the surface of the interlayer film 140 rough. Therefore, in this embodiment of the semiconductor device the adhesion between the interlayer film 140 and the sealing film 180 is even greater than in the semiconductor device in the first embodiment.

FIG. 8 is a sectional diagram showing the method of manufacturing the semiconductor device according to this embodiment.

In this embodiment, an integrated circuit (not shown in the Figures), electrode pad 120, protective layer 130, interlayer film 140, modifying layer 141, metallic thin film 150, metallic wiring 160 and bump 170 are successively formed in the same manner as in the first embodiment (see FIGS. 3A to 3G, 4A to 4D, 5A and 5B).

Figure 8A:
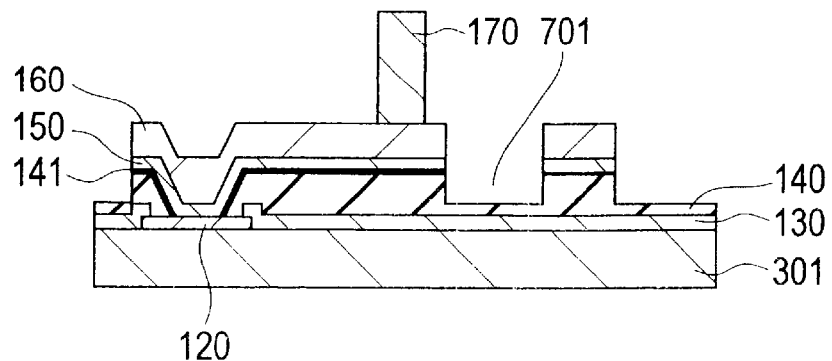
FIGS. 8 to 8C are sectional process diagrams illustrating the method of manufacturing a semiconductor device according to the second embodiment.

Next, as shown in FIG. 8A, the exposed surface of the modifying layer 141 is removed by plasma etching. Furthermore, by means of this plasma etching, part of the interlayer film 140 below this modifying layer 141 is also removed. As a result of this the trench 701 is formed in the interlayer film 140.

By means of this plasma etching, it is possible to prevent electrical leakage from the metallic wiring 160, in the same way as with wet etching in the first embodiment. In addition, the adhesion in the contact surface between the interlayer film 140 and the sealing film 180 can he improved. In the present invention, the depth of the trench 701 is not limited but in order to make the contact surface larger, it is desirable to etch until just before the protective layer 130 is exposed.

Figure 8B:
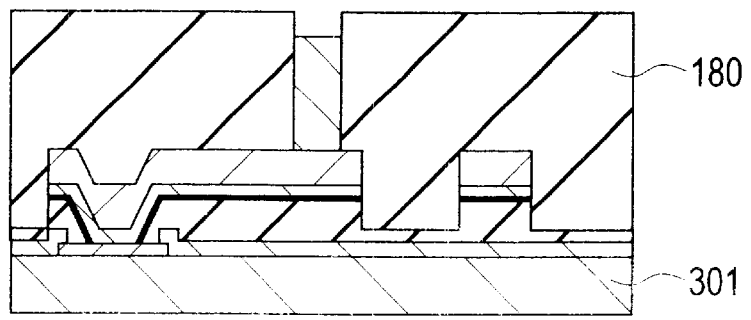
Figure 8C:
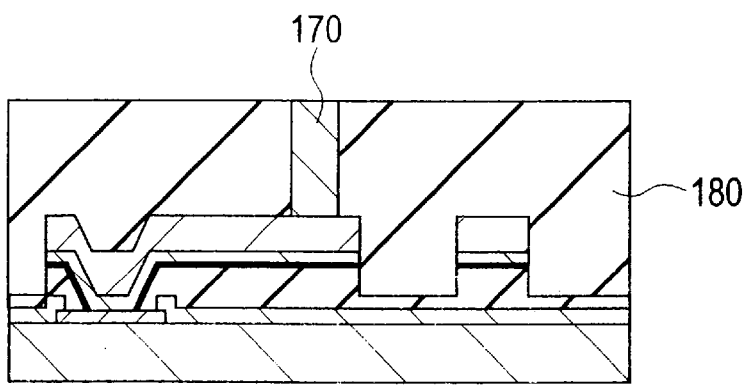

Next, as shown in FIG. 8B, in the same way as in the first embodiment, a sealing film 180 is formed in the surface of the wafer 301. Furthermore, the upper end of the bump is exposed by polishing the surface of the sealing film 180, as shown in FIG. 8C.

Next, the external terminal 190 is formed on the upper end of the bump 170 (see FIG. 7). As mentioned above, this external terminal 190 is formed, for example from solder and into a hemispherical shape.

Finally, the dicing process is carried out. In this process, the wafer 301 is cut up into chips. In this way, the semiconductor device as shown in FIGS. 1 and 7 is completed.

As explained above, in this embodiment of the semiconductor, it is possible to form an extremely deep trench 701 without reducing the yield of the semiconductor device or its reliability. Therefore, the adhesion between the interlayer film 140 and the sealing film 180 is greatly improved. For this reason, this embodiment of the semiconductor has the advantage that it is difficult for the sealing film 180 to become detached, so that it is highly reliable.

In addition, in the method of manufacturing this embodiment the modifying layer 141 can be removed at the same time as the trench 142 is formed in the interlayer film 140. Therefore, there is the advantage that with this embodiment of the manufacturing process a highly reliable semiconductor can be manufactured using a small number of processes.

Third Embodiment

Next, the third embodiment of the present invention will be explained with reference to FIGS. 9, 10 and 11.

Figure 9:
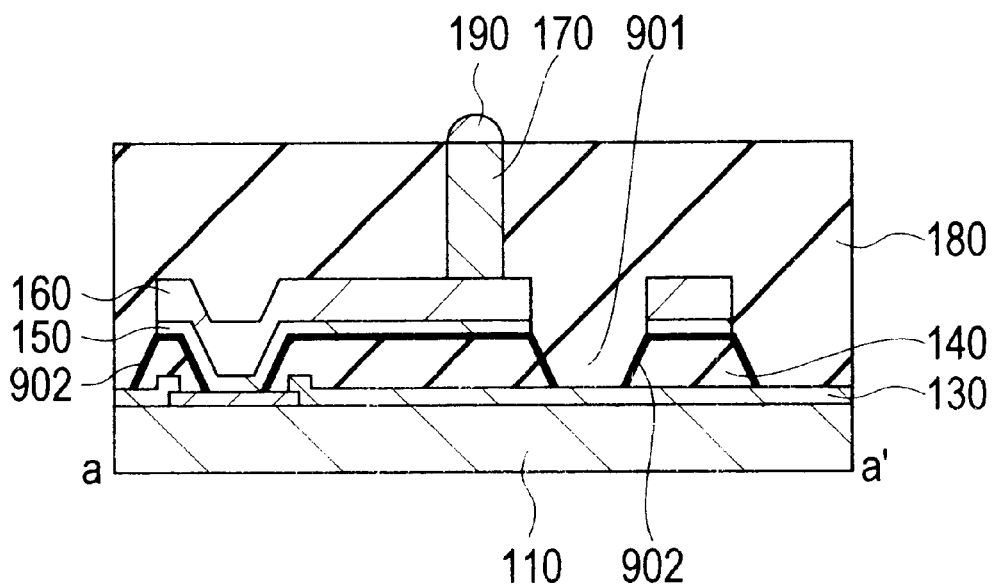
FIG. 9 is a sectional diagram showing the structure of the essential parts of a semiconductor device to according to the first embodiment.

FIG. 9 is a sectional diagram of this embodiment, corresponding to the sectional view along line a–a' in FIG. 1. In FIG. 9, wherever the same symbols are used as in FIG. 2, they refer to the same structural elements as in FIG. 2.

In this embodiment, the formation of the trench after the formation of the bump 170 as in each of the embodiments above does not take place and the trench 901 is formed at the same time as the etching of the interlayer film 140 for the purpose of exposing the center part of the electrode pad 120. In this embodiment, the surface of the interlayer film 140 is modified after the trench 901 is formed so that the modifying layer 902 is also formed on the surface of the trench 901.

The method of manufacturing this embodiment will be explained below in detail with reference to FIGS. 10 and 11.

Firstly, in the same way as in the first embodiment, an integrated circuit, electrode pads 120 and a protective film 130 are formed on the surface of the wafer 301 (see FIGS. 3A and 3B).

Next, the interlayer film 140 is formed on top of the protective film 130, the interlayer film 140 comprising the opening 1001 on top of the electrode pad 120 and the trench 901. In this embodiment, the trench 901 is formed in such a way that the protective layer 130 is exposed. For example, if the interlayer film 140 is formed from polyimide, this interlayer film 140 is formed as explained below.

Figure 10A:
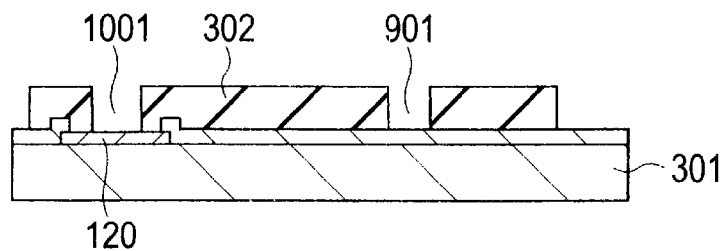
FIGS. 10A to 10F, 11A and 11B are sectional process diagrams illustrating the method of manufacturing a semiconductor device according to the third embodiment.
Figure 10B:
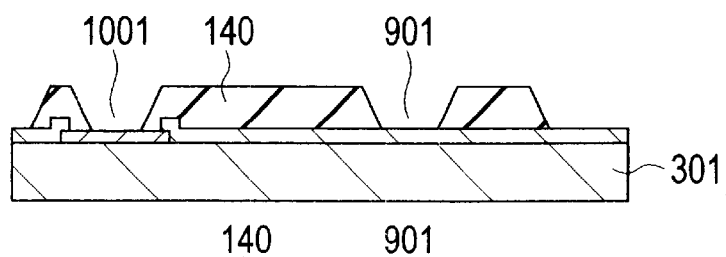

Firstly, in the same way as in the first embodiment, a polyimide precursor 302 is deposited over the entire surface of the wafer 301 (see FIG. 3C). Next, as shown in FIG. 10A, an opening 1001 and a trench 901 are formed in the polyimide precursor 302 using a photolithography method and an etching technique. Then, by thermosetting the polyimide precursor 302, the polyimide interlayer film 140, as shown in FIG. 10B, is completed. This thermosetting process causes the interlayer film 140 to shrink. The rate of shrinkage of the interlayer film 140 is greater toward the upper face of the interlayer film 140 and for this reason the opening 1001 acquires a tapering section.

After this, if there is residual polyimide on the surface of the electrode pad 120, this polyimide is removed using, for example, plasma etching in an oxygen atmosphere.

Figure 10C:
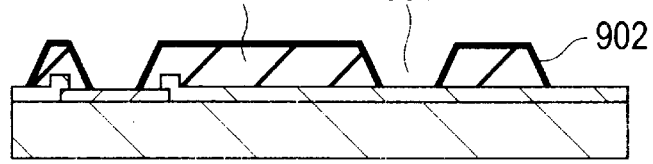

Next, the surface of the interlayer film 140 is modified by plasma processing in an inert gas atmosphere (for example argon gas). Thereby, the modifying layer 902 (as shown in FIG. 10C) is formed. As mentioned above, the adhesion between the interlayer film 140 and the metallic thin film 150 is improved by this modifying layer 902. In this embodiment, the surface of the interlayer film 140 is modified after the trench 901 is formed so that the modifying layer 902 is also formed on the side faces of the trench 901. Meanwhile, the protective film 130 is exposed at the bottom face of the trench 901 and therefore the modifying layer 902 is not formed on this bottom face. For this reason, the rewiring patterns 150, 160 are not electrically conductive via the modifying layer 902, and therefore even if the exposed modified film 902 is not removed, leakage currents will not occur.

Figure 10D:
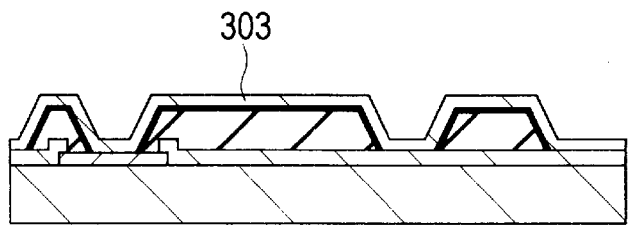
Figure 10E:
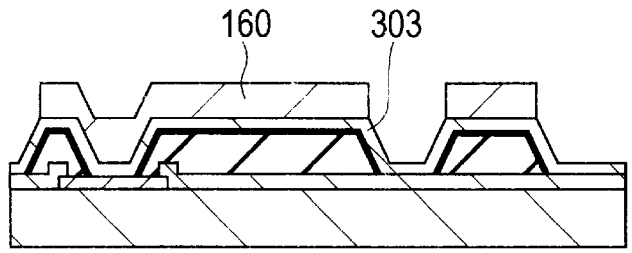

Next, metallic thin film 303 as shown in FIG. 10D is formed over the entire surface of the modifying layer 902 using spattering, for example. Then, in the same way as in the first embodiment, the pattern of the metallic wiring 160 as shown in FIG. 10E is formed.

Figure 10F:
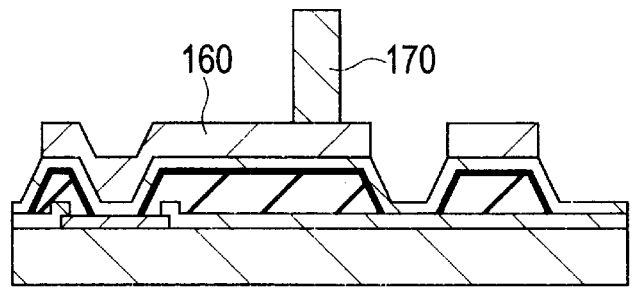

Next, in the same way as in the first embodiment, the bump 170 as shown in FIG. 10F is formed.

Figure 11A:
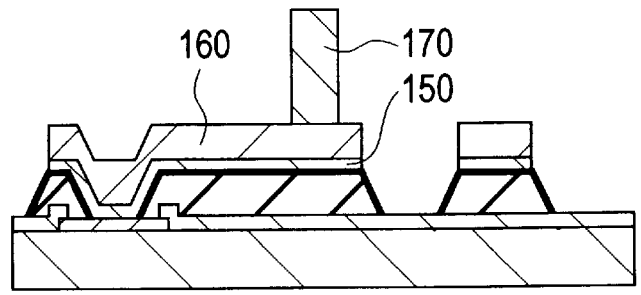

Then, in the same way as in the first embodiment, the exposed part of the metallic thin film 303 is removed. In this way, the pattern of the metallic thin film 150 as shown in FIG. 11A is completed.

Figure 11B:
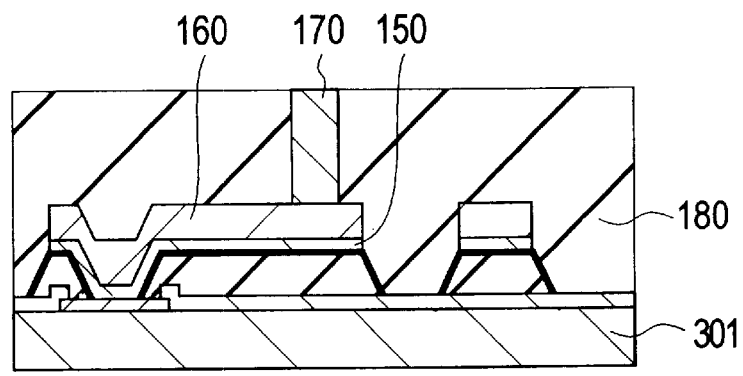

Then, in the same way as in the first embodiment, the sealing film 180 as shown in FIG. 11B is completed.

After this, the external terminal 190 is formed on the upper end of the bump 170 and the semiconductor device is completed by dicing the wafer 301.

In the semiconductor device according to this embodiment, in the same way as in the semiconductor devices according to the embodiments above, the contact area between the interlayer film 140 and the sealing film 180 is made larger and therefore it is difficult for the sealing film 180 to become detached.

In addition, in the manufacturing method according to the present embodiment, by one etching of the interlayer film 140, both the electrode pad 120 and the trench 901 can be formed at the same time. In addition, in the present embodiment, the surface of the interlayer film 140 is modified after the trench 190 is formed so that there is no need for a process to remove the exposed modifying layer 902. Therefore, there is one patterning process less than in the embodiments above so that the manufacturing costs are low.

Fourth Embodiment

Next, a fourth embodiment of the present invention will be explained with reference to FIGS. 12, 13 and 14.

Figure 12:
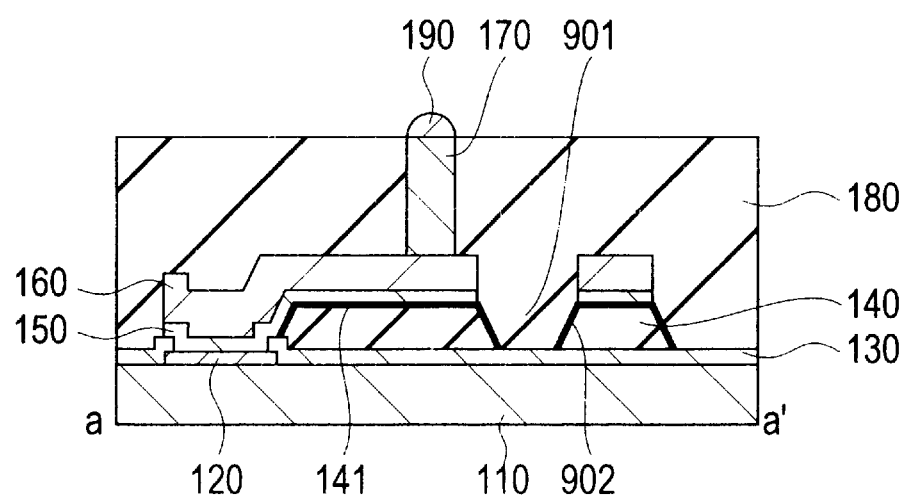
FIG. 12 is sectional diagram showing the structure of the essential parts of a semiconductor device according to the fourth embodiment.

FIG. 12 is a sectional diagram of this embodiment, corresponding to the sectional view along line a–a' in FIG. 1. In FIG. 12, wherever the same symbols are used as in FIG. 9, they refer to the same structural elements as in FIG. 9.

In the semiconductor device according to the present embodiment, the opening in the interlayer film 140 is not formed in such a way that only the center part of the electrode pad 120 is exposed but rather differs from the semiconductor device according to the third embodiment in that it is formed in such a way that all of the region not covered by the protective film 130 is exposed. In other words, the electrode pad 120 in the present embodiment is in contact with the metallic thin film 150 in all of the region in which the outer peripheral part covered by the protective film 130 has been removed.

Below, the method of manufacturing this embodiment will be explained in detail with reference to FIGS. 13 and 14.

Firstly, in the same way as in the first embodiment, an integrated circuit, electrode pads 120 and a protective film 130 are formed on the surface of the wafer 301 (see FIGS. 3A and 3B). In the same way as in the first embodiment, an opening is provided in the protective layer 130 in order to expose the electrode pad 120.

Figure 13A:
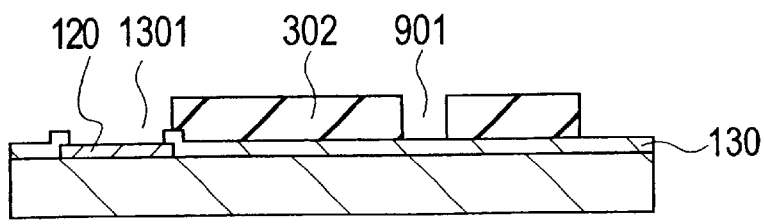
FIGS. 13 to 13F, 14A and 14B are sectional process diagrams illustrating the method of manufacturing a semi conductor device according to the fourth embodiment.
Figure 13B:
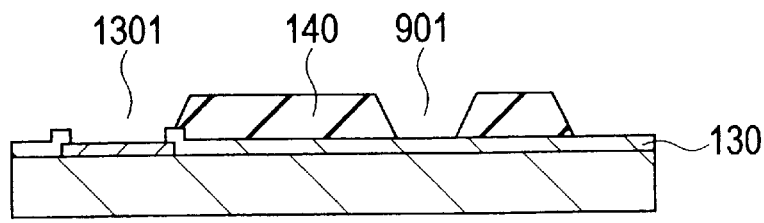

Next, a polyimide precursor 302 is formed on top of the protective film 130, the polyimide precursor 302 comprising an opening 1301 on top of the electrode pad 120 and a trench 901. The opening 1301 in the polyimide precursor 302 is formed in such a way that the side face of the opening in the protective film 130 is exposed, in other words in such a way that all of the region of the electrode pad 120 which is not covered by the protective film 130 is exposed. After this, an interlayer film 140 (as shown in FIG. 13B) is formed by heat-treating this polyimide precursor.

After this, if there are polyimide residues on the surface of the electrode pad 120, this polyimide is removed by plasma etching in an oxygen atmosphere, for example.

Figure 13C:
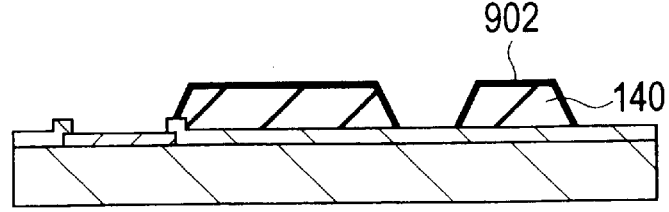

Next, the surface of the interlayer film 140 is modified by plasma processing in an inert gas atmosphere (for example argon gas). By this means, the modifying layer 902 as shown in FIG. 13C is formed.

Figure 13D:
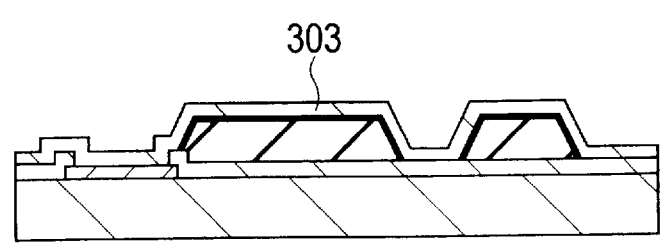

Then, a metallic thin film 303 (as shown in FIG. 13D) is formed over the entire modifying layer 902 by sputtering, for example. In this embodiment, an interlayer film 140 is not formed on top of the electrode pad 120 so that the contact area between the electrode pad 120 and the metallic thin film 150 becomes large in that part only.

Figure 13E:
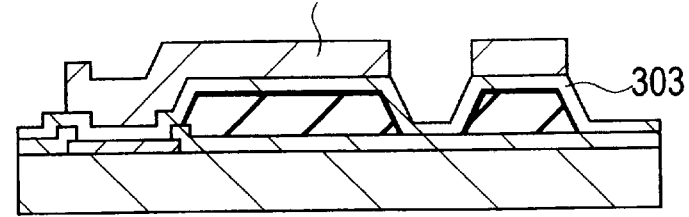

The pattern of the metallic wiring 160 (as shown in FIG. 13E) is formed in the same way as in the first embodiment.

Figure 13F:
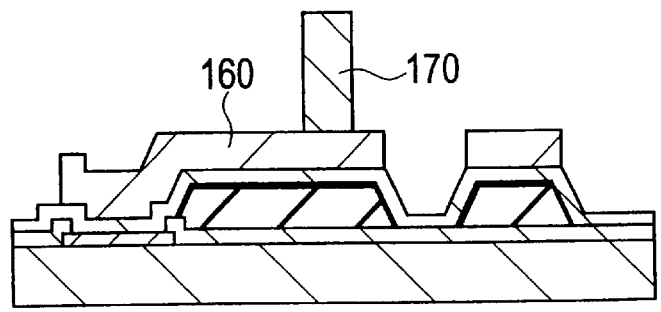

Next, the bump 170 as shown in FIG. 13F is formed in the same way as in the first embodiment.

Figure 14A:
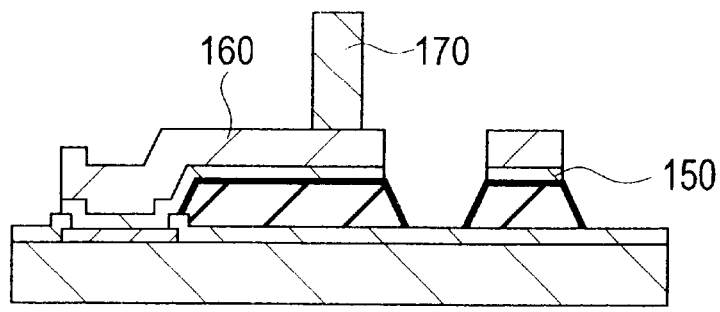

Then, in the same way as in the first embodiment, the exposed part of the metallic thin film 303 is removed. By this means, the pattern of the metallic thin film 150 as shown in FIG. 14A is completed.

Figure 14B:
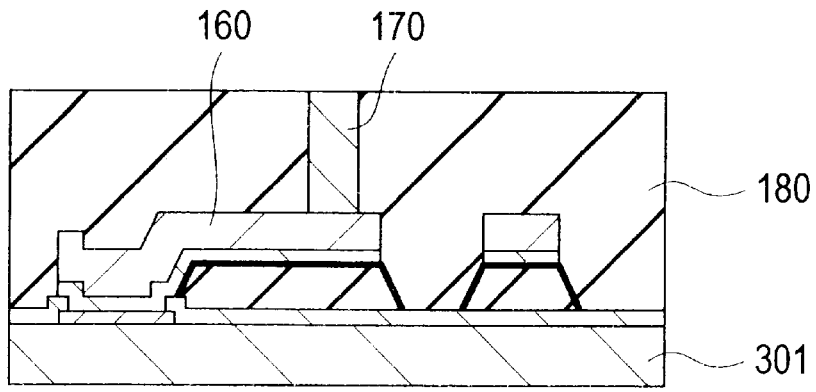

Then, in the same way as in the first embodiment, the sealing film 180 as shown in FIG. 14B is completed.

After this, the external terminal 190 is formed on the upper end of the bump 170 and the semiconductor is completed by dicing the wafer 301.

In the semiconductor device according to this embodiment, in the same way as in the semiconductor devices according to the embodiments above, the contact area between the interlayer film 140 and the sealing film 180 is made larger and therefore it is difficult for the sealing film 180 to become detached. In addition, in the semiconductor device according to the present embodiment, the contact area between the electrode pad 120 and the metallic thin film 150 becomes large and therefore it is difficult for the metallic thin film 150 and the metallic wiring 160 to become detached. For this reason, in the semiconductor device according to the present embodiment the reliability is even higher than in the semiconductor device according to the embodiments above.

With the manufacturing method according to the present embodiment, it is possible to reduce the manufacturing costs for the same reasons as with the third embodiment.

What is claimed is:

1. A method for manufacturing a semiconductor device comprising steps of:

forming an electrode pad and an integrated circuit on top of a substrate;

forming, on top of said substrate, a covering film which comprises an opening on top of said electrode pad;

forming, on top of said covering film, a rewiring pattern which is in contact with said electrode pad at said opening;

forming in a region of said covering film beneath which said integrated circuit is formed and said rewiring pattern is not formed, a trench that does not expose the integrated circuit;

forming a bump on top of said rewiring pattern; and forming a sealing film which covers said rewiring pattern and said trench, in such a way that said sealing film exposes the upper end of said bump.

2. The method for manufacturing a semiconductor device according to claim 1, wherein said step of forming a covering film comprises steps of:

forming, on top of said substrate, a protective film which comprises a first opening on top of said electrode pad; and forming, on top of said protective film, an interlayer film which comprises a second opening on top of said electrode pad.

3. The method for manufacturing a semiconductor device according to claim 2, further comprising a step of forming, on the surface of said interlayer film, a modifying layer for improving the adhesion of the interlayer film with respect to said rewiring pattern.

4. The method for manufacturing a semiconductor device according to claim 3 wherein said step of forming a modifying layer comprises a step of performing plasma processing on the surface of said interlayer film.

5. The method for manufacturing a semiconductor device according to claim 1, wherein said step of forming a rewiring pattern comprises steps of:

forming an metallic thin film for improving the adhesion of this rewiring pattern with respect to said covering film, and forming metallic wiring on the surface of said metallic thin film.

6. The method for manufacturing a semiconductor device according to claim 3, wherein said modifying layer is segmented at each rewiring pattern by means of said step of forming a trench.

7. The method for manufacturing a semiconductor device according to claim 1, wherein said step of forming a trench comprises a wet etching process.

8. The method for manufacturing a semiconductor device according to claim 1, wherein said step of forming a trench comprises an anisotropic etching process.

9. The method for manufacturing a semiconductor device according to claim 8, wherein said anisotropic etching is plasma etching.

10. The method for manufacturing a semiconductor device according to claim 2, wherein said step of forming a trench is the same step as a step of providing a second opening in said interlayer film.

11. The method for manufacturing a semiconductor device according to claim 2, wherein said step of forming a trench is a step of forming a trench with a depth which causes said protective film to be exposed.

12. The method for manufacturing a semiconductor device according to claim 2, wherein the first opening of the protective film has a side face, and wherein said step of forming an interlayer film includes a step of forming said second opening so that said side face is exposed.

13. The method for manufacturing a semiconductor device according to claim 1 further comprising a step of forming an external terminal on top of said bump.

14. The method for manufacturing a semiconductor device according to claim 1, wherein said semiconductor device is manufactured by means of a wafer level chip size package method.

15. A method for manufacturing a semiconductor device comprising steps of:

forming an electrode pad and an integrated circuit on a substrate;

forming a covering film that covers the integrated circuit and has an opening that exposes the electrode pad;

forming a rewiring pattern on a covering region of the covering film that excludes a trench region of the covering film, the wiring pattern contacting the electrode pad at the opening;

forming a trench in the trench region of the covering film;

forming a bump on the rewiring pattern; and forming a sealing film that covers the rewiring pattern and the trench, such that the sealing film exposes an upper end of the bump.

16. The method for manufacturing a semiconductor device according to claim 15, wherein said step of forming a covering film comprises steps of:

forming on the substrate a protective film, the protective film having a first opening exposing the electrode pad, and forming on top of said protective film, an interlayer film having a second directly over the first opening so as to expose the electrode pad.

17. The method for manufacturing a semiconductor device according to claim 16, further comprising the step of forming, on the surface of said interlayer film, a modifying layer that increases adhesion of the interlayer film with respect to the rewiring pattern.

18. The method for manufacturing a semiconductor device according to claim 17, wherein said step of forming a modifying layer comprises performing plasma processing on the surface of the interlayer film.

19. The method for manufacturing a semiconductor device according to claim 15, wherein said step of forming a rewiring pattern comprises steps of:

forming over the covering film a metallic thin film that increases adhesion of the rewiring pattern with respect to the covering film, and forming metallic wiring on the surface of said metallic thin film.

20. The method for manufacturing a semiconductor device according to claim 16, wherein said step of forming a trench exposes the protective film.

21. The method for manufacturing a semiconductor device according to claim 16, wherein the first opening has a side face, and wherein said step of forming an interlayer film includes forming the second opening so that the side face is exposed.

22. A method for manufacturing a semiconductor device comprising steps of:

forming an electrode pad and an integrated circuit on a substrate;

forming a protective film over the integrated circuit with a first opening that exposes the electrode pad, forming, an interlayer film over the protective film, with a second opening directly over the first opening so as to expose the electrode pad;

forming a modifying layer over the interlayer film;

forming a rewiring pattern on the modifying layer so as to cover a covering region of the interlayer film that excludes a trench region of the interlayer film, the wiring pattern contacting the electrode pad at the first opening, the modifying layer increasing the adhesion of the interlayer film with respect to the rewiring pattern;

forming a trench in the trench region of the interlayer film;

forming a bump in contact with an upper surface of the rewiring pattern; and forming a sealing film that covers the rewiring pattern and the trench, such that the sealing film exposes an upper end of the bump.

23. The method for manufacturing a semiconductor device according to claim 22, wherein said step of forming a trench includes removing a portion of the modifying layer over the trench region.

24. A method for manufacturing a semiconductor device comprising steps of:

providing a semiconductor substrate having an integrated circuit on a surface thereof;

forming an electrode pad on the substrate surface in contact with the integrated circuit;

forming an insulating layer on the substrate surface so as to expose the electrode pad, the insulating layer having a first region that includes a vicinity of the exposed electrode pad, and having a second region that excludes the first region;

forming a conductive layer on the exposed electrode pad, the conductive layer covering the insulating layer only in the first region;

removing a surface portion of the insulating layer in the second region; and forming a resin layer over the first and second regions of the insulating layer and the conductive layer.

25. A method for manufacturing a semiconductor device comprising steps of:

forming an electrode pad on top of a substrate;

forming, on top of said substrate, a covering film which comprises an opening on top of said electrode pad;

forming, on top of said covering film, a rewiring pattern which is in contact with said electrode pad at said opening;

forming a trench in a region of said covering film over which said rewiring pattern is not formed, said trench being separated from said opening by a portion of said covering film;

forming a bump on top of said rewiring pattern; and forming a sealing film which covers said rewiring pattern and said trench, in such a way that said sealing film exposes the upper end of said bump.

26. A method for manufacturing a semiconductor device comprising steps of:

forming an electrode pad on top of a substrate;

forming, on top of said substrate, a covering film which comprises an opening on top of said electrode pad;

forming, on top of said covering film, a rewiring pattern which is in contact with said electrode pad at said opening;

after said step of forming the rewiring pattern, removing a portion of the covering film from a region of the covering film, spaced from the covering film opening, over which the rewiring pattern is not formed, thereby to form a trench in the covering film region, the trench being spaced from the opening;

forming a bump on top of said rewiring pattern; and forming a sealing film which covers said rewiring pattern and the trench, in such a way that said sealing film exposes the upper end of said bump.

* * * * *